United States Patent [19]

Ching et al.

[11] Patent Number: 4,634,861
[45] Date of Patent: Jan. 6, 1987

[54] ROTARY SWITCH WITH REFLECTOR CODED ACTUATOR DRUM

[75] Inventors: Stephen Ching, San Jose; Frank B. Babbitt, Jr., Palo Alto; Adnan Merchant, San Jose, all of Calif.

[73] Assignee: General Instrument Corporation, New York, N.Y.

[21] Appl. No.: 683,600

[22] Filed: Dec. 19, 1984

[51] Int. Cl.⁴ .............................................. G01D 5/34
[52] U.S. Cl. ............................ 250/231 SE; 250/229
[58] Field of Search ............ 250/229, 231 SE, 237 G, 250/231 GY, 221; 340/365 P

[56] References Cited

U.S. PATENT DOCUMENTS

| 3,603,982 | 9/1971 | Patti | 340/365 P |
| 3,697,762 | 10/1972 | Kurtz | 250/239 |
| 3,886,544 | 5/1975 | Narodny | 340/365 P |
| 4,045,667 | 8/1977 | Hanson | 250/226 |
| 4,123,653 | 10/1978 | Bovio | 250/231 SE |
| 4,201,911 | 5/1980 | Dering | 250/231 SE |
| 4,224,604 | 9/1980 | Angst | 250/231 SE X |
| 4,340,813 | 7/1982 | Sauer | 250/221 |
| 4,521,875 | 6/1985 | Harrington | 250/231 SE X |
| 4,555,625 | 11/1985 | Mosier et al. | 250/231 SE |

Primary Examiner—Eugene R. LaRoche
Assistant Examiner—Steven J. Mottola
Attorney, Agent, or Firm—Barry R. Lipsitz

[57] ABSTRACT

A multi-position rotary switch comprises an actuator drum divided into a plurality of different n-bit codes where each bit is represented by a reflective area or a non-reflective area on the drum. The drum is radiated by a suitable emitter and radiation reflected off of the drum by reflective bits is detected by a plurality of radiation detectors. The drum is rotatable to bring the different n-bit codes into view of the radiation detectors. Each different n-bit code detected by the radiation detectors is indicative of a particular switch position.

5 Claims, 6 Drawing Figures

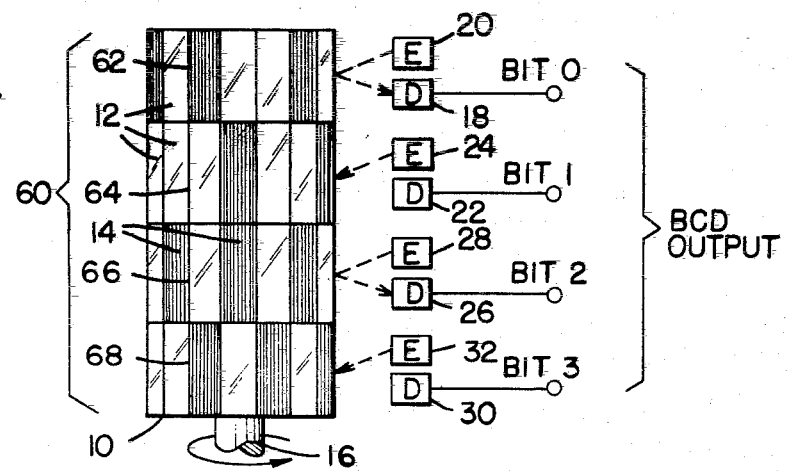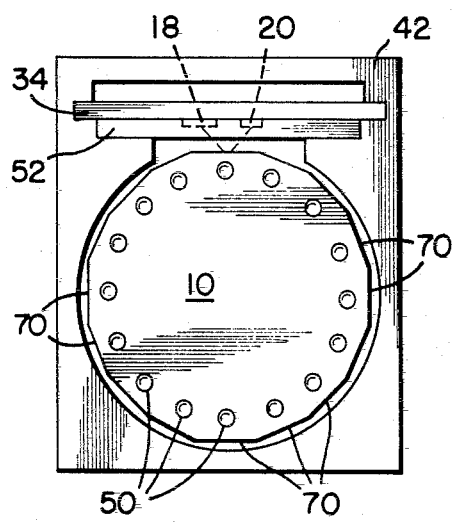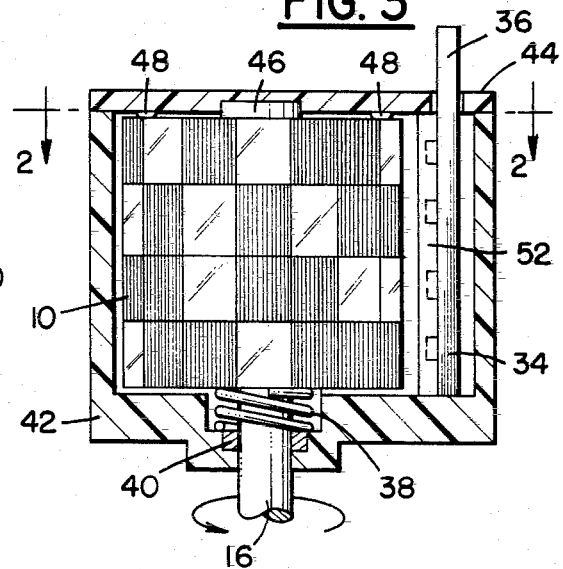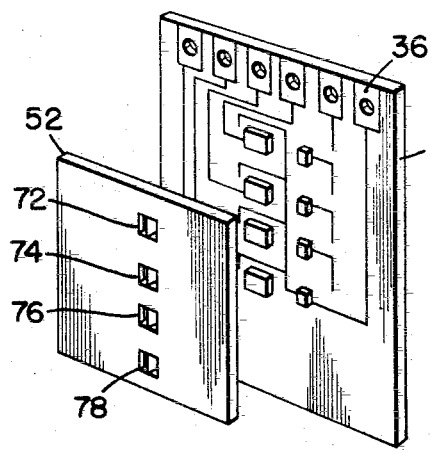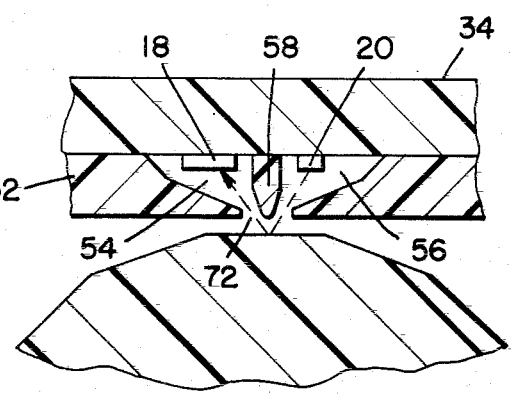

ROTARY SWITCH WITH REFLECTOR CODED ACTUATOR DRUM

BACKGROUND OF THE INVENTION

The present invention relates to a multi-position rotary switch and more particularly to a rotary switch using radiation emitters and detectors where a rotatable drum coded with reflective and non-reflective areas is used to actuate the switch.

Various forms of optical switches are known in the prior art. For example, U.S. Pat. No. 3,603,982 discloses a data entry or keyboard type switch arrangement using reflected light as a means of encoding characters. Each character is represented by a key on the keyboard. For each character, a photosensitive device is also provided, located in alignment with the corresponding data entry element in a lightproof housing. A light source is provided in the housing to provide illumination between the keys and the photosensitive devices. A reflective surface mounted on an angle on each key intercepts light from the light source and reflects it onto the photosensitive device corresponding to the key when the key is actuated. A signal is thereby produced which is effective, through a logical encoding network, to produce an output signal representing the character corresponding to the actuated key. In this arrangement, a separate reflector is provided for each key.

U.S. Pat. No. 3,697,762 provides a single keyswitch having a light emitting diode and light-sensing element arranged in side-by-side relation. A light reflecting element is arranged so that when it is passed into the path of radiant energy emanating from the light emitting diode, a portion of the light beam is reflected to the light-sensing element so as to initiate an "on" or an "off" function. Each keyswitch is a self-contained unit requiring its own reflecting element, light emitter, and light detector.

U.S. Pat. No. 3,886,544 discloses a keyboard using optical switching. Light is transmitted and received by fiber optic conductors. Actuation of a keyswitch brings a reflector into view of the fiber optic conductors, thereby completing a switching function.

Another prior art arrangement using fiber optics is shown in U.S. Pat. No. 4,045,667. This patent relates to a color-sensitive photoelectric control system where different switching functions are actuated using color coded light. In U.S. Pat. No. 4,340,813 a switch panel with touch switches is disclosed. Radiation is reflected or dispersed when a switch space is touched so that sensors are actuated by the dispersed radiation.

The prior art does not disclose a multi-position rotary switch using the reflection and detection of radiation to indicate switch actuations. It would be advantageous to provide such a rotary switch which is simple in design, highly reliable, and relatively inexpensive to manufacture. It would be further advantageous to provide such a switch with a coded output, such as binary coded decimal ("BCD"), to provide simple interface to an external electronic circuit in which the switch is used.

The present invention provides such a multi-position rotary switch using an actuator drum coded with reflective and non-reflective areas. The switch uses reflective surfaces to complete optical circuits and non-reflective surfaces to inhibit the completion of such circuits. In a preferred embodiment, the rotary switch of the present invention uses an actuator drum divided into a plurality of different n-bit codes where each bit is represented by a reflective area or a non-reflective area on the drum. A separate emitter-detector pair is arranged to emit radiation and detect radiation from each different bit of the n-bit codes. Each different n-bit code detected by the emitter-detector pairs as the actuator drum is rotated is indicative of a particular switch position.

SUMMARY OF THE INVENTION

In accordance with the present invention, a multi-position rotary switch is provided comprising an actuator drum divided into a plurality of different n-bit codes where each bit is represented by a reflective area or a non-reflective area on the drum. Radiation emitter means are provided for radiating the drum and radiation detector means are provided for reading the n-bit codes by detecting radiation reflected off of the drum by reflective bits. Means are provided for rotating the drum to successively bring the different n-bit codes into view of the radiation detector means. In this manner, each different n-bit code detected by the radiation detector means is indicative of a particular switch position.

Detent means can be provided for successively stopping the drum in position for the radiation detector means to read successive n-bit codes as the drum is rotated. The different n-bit codes can be arranged on the drum in longitudinal strips.

The switch can further comprise a housing containing the drum, emitter means, and detector means. Shaft means can be coupled to the drum and extend through the housing for use in rotating the drum.

DESCRIPTION OF THE DRAWINGS

FIG. 1 is a diagrammatic view illustrating a multi-position rotary switch in accordance with the present invention;

FIG. 2 is a cross-sectional view taken along the lines 2—2 shown in FIG. 3;

FIG. 3 is a cross-sectional view of a multi-position rotary switch in accordance with the present invention showing the actuator drum and shaft mounted in a housing with radiation emitter and detector means adjacent the drum;

FIG. 4 is an exploded view of the radiation emitter and detector assembly used in the switch of FIGS. 2 and 3;

FIG. 5 is an enlarged detail view showing the reflection of radiation from a radiation emitter off of a reflective area on the actuator drum and toward a radiation detector.

DETAILED DESCRIPTION OF THE INVENTION

Figure 6:
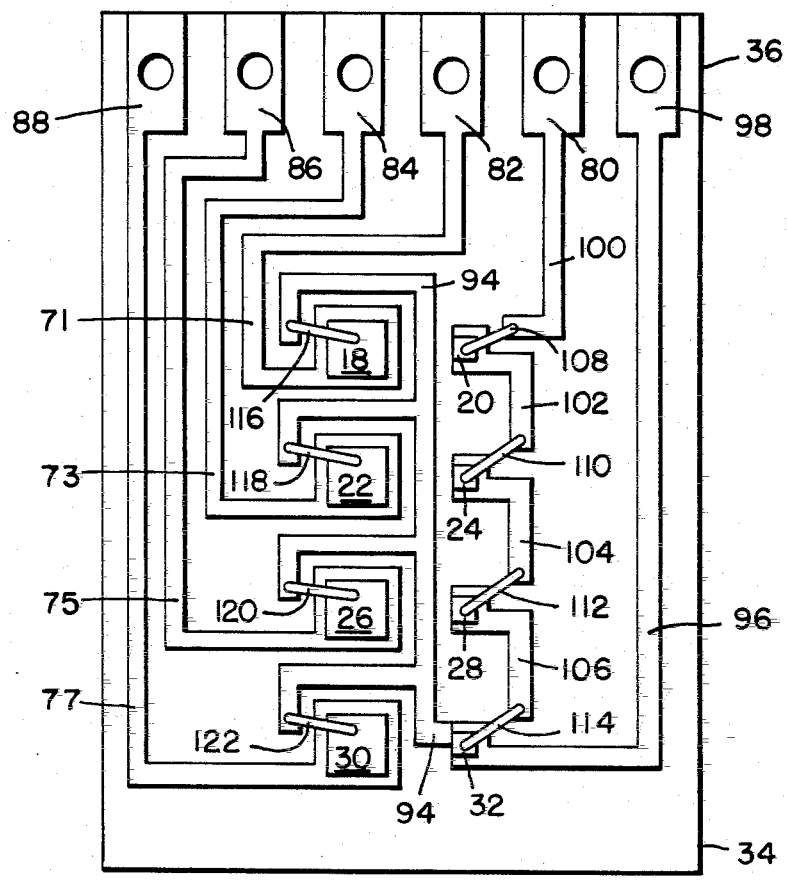
FIG. 6 is an enlarged plan view of the circuit board containing the radiation emitter and detector means.

The multi-position rotary switch of the present invention utilizes an actuator drum 10 divided into a plurality of different n-bit codes 60 where each bit is represented by a reflective area 12 or a non-reflective area 14 on drum 10. As illustrated in FIG. 1, each code 60 comprises four bits 62, 64, 66, and 68. The 4-bit codes 60 are arranged on drum 10 in longitudinal strips. An emitter-detector pair is provided for each different bit in the 4-bit codes shown in FIG. 1. For example, emitter 20 and detector 18 are provided to read the top bits (i.e., bit 62) of each 4-bit code. Emitter 24 and detector 22 are provided to read the second bit (i.e., bit 64) of each 4-bit code on drum 10. Similarly, emitter 28 and detector 26 read the third bit of each 4-bit code (i.e., bit 66) and emitter 32 together with detector 30 read the fourth bit in each 4-bit code (i.e., bit 68) on drum 10. The emitters 20, 24, 28 and 32 shown for the 4-bit code arrangement in FIG. 1 radiate appropriate areas of the drum so that the presence or absence of a reflective bit can be determined by detectors 18, 22, 26, and 30 respectively. The outputs from the detector of each emitter-detector pair are used to provide a 4-bit BCD output which identifies the different switch positions of the multi-position rotary switch.

When the actuator drum 10 is made up of 4-bit codes and four emitter-detector pairs are provided, a total of sixteen different switch positions can be identified. Those skilled in the art will recognize that the number of switch positions that can be detected by n emitter-detector pairs reading n-bit codes is equal to $2^n$. Thus, if 3-bit codes where placed on actuator drum 10 and three emitter-detector pairs were used to detect the codes, a total of $2^3$ or (i.e., eight) different switch positions could be read. The actuator drum 10 illustrated in FIG. 1 contains sixteen different 4-bit codes (only seven are visible in the drawing) providing a sixteen position rotary switch. As drum 10 is rotated using actuator shaft 16, each of the sixteen different 4-bit codes will successively come into view of the emitter-detector pairs. The BCD output of the emitter-detector pairs will identify which of the sixteen positions the switch is in at a given time.

A preferred embodiment of a switch in accordance with the present invention is illustrated in FIGS. 2 through 6. A housing comprising casing 42 and end cap 44 contains rotatable drum 10. Shaft 16 is coupled to drum 10 to enable a user to rotate the drum. Shaft 16 extends through a bushing 40 in casing 42. A spring 38 sandwiched between drum 10 and casing 42 biases drum 10 toward end cap 44 of the housing. Projections 48 extending from the inside of end cap 44 mate with corresponding detents 50 on the end of drum 10 and around the circumference thereof. As drum 10 is rotated within the housing, projections 48 and detents 50 will successively stop drum 10 in position for emitter-detector pairs 20, 18; 24, 22; 28, 26; and 32, 30 to read successive n-bit codes as the drum is rotated. A bearing 46 maintains drum 10 in proper rotatable position with respect to housing end cap 44. Drum 10, as shown in FIGS. 2, 3, and 5 contains sixteen facets 70, each facet containing a separate 4-bit code of reflective or non-reflective surfaces.

The emitter-detector pairs used to radiate the drum and read the n-bit codes by detecting radiation reflected off of the drum are mounted on a printed circuit board 34. The circuit board is shown in greater detail in FIG. 6. Emitters 20, 24, 28, and 32 are deposited on circuit board 34 and connected in series through traces 100, 102, 104, 106, and 96 together with wires 108, 110, 112, and 114 bonded between the traces and the emitter chips. A terminal 98 coupled to trace 96 serves as a common terminal for the emitters and detectors on circuit board 34. Terminal 80 coupled to trace 100 serves as an emitter drive terminal to which power for the emitters can be connected.

Detectors 18, 22, 26, and 30 are similarly mounted on circuit board 34. Each detector is associated with a corresponding trace 71, 73, 75, or 77. These traces are used to connect the detectors to corresponding detector terminals 82, 84, 86, 88 on the terminal edge 36 of circuit board 34. Detectors 18, 22, 26, and 30 are coupled via wires 116, 118, 120, 122, respectively, to a common trace 94 which is coupled to common terminal 98 via trace 96. When radiation is detected by a detector on circuit board 34, a corresponding signal will be developed across terminal 98 and the terminal 82, 84, 86, or 88 corresponding to the radiated detector.

Circuit board 34 is mounted in housing 42, 44 with terminal end 36 extending beyond housing end cap 44. This enables the rotary switch to be coupled to an electrical circuit by plugging terminal end 36 into a conventional connector coupled to the electric circuit. A mask 52, best shown in FIGS. 4 and 5, is mounted to circuit board 34 on the side thereof containing the emitter-detector pairs. Mask 52 includes a plurality of two-port openings 72, 74, 76, 78 for each emitter-detector pair. These openings increase the reliability of the rotary switch by properly orienting the radiation emitted and detected by each emitter-detector pair. As shown in FIG. 5, two-port opening 72 directs radiation from emitter 20 through chamber 56 to drum 10 and, if a reflective surface is present on drum 10 as shown, the radiation is reflected to detector 18 through chamber 54. Chamber 54 is separated from chamber 56 by divider 58.

We claim:
1. A multi-position rotary switch comprising:
    an actuator drum divided into a plurality of different n-bit codes where each bit is represented by a reflective area of a non-reflective area on the drum;
    a plurality of emitter-detector pairs each including an emitter means for providing radiation; and
    detector means for reading the n-bit codes by detecting said radiation reflected off the reflective area of said drum, said pairs each arranged to emit radiation to and detect radiation from a different bit in the n-bit codes;
    a circuit board positioned adjacent to said drum with said emitter-detector pairs facing said drum and longitudinally arranged to correspond to said longitudinal strips;
    means for rotating said drum to successively bring the different n-bit codes into view of said radiation detector means;
    whereby each different n-bit code detected by said radiation detector means is indicative of a particular switch position.
2. The switch of claim 1 further comprising detent means for successively stopping said drum in position for said radiation detector means to read successive n-bit codes as the drum is rotated.
3. The switch of claim 1 further comprising:
    a housing containing said drum, emitter means, and detector means; and
    shaft means coupled to said drum and extending through said housing for use in rotating the drum.
4. The switch of claim 1 wherein said circuit board further comprises mask means having a plurality of two-port openings, said mask means fixed to said circuit board in registration with each of said emitter-detector pairs for orienting the radiation emitted and detected by each emitter-detector pair.
5. The switch of claim 1 wherein said emitter-detector pairs are configured on said circuit board to be substantially coplanar.

* * * * *

UNITED STATES PATENT AND TRADEMARK OFFICE
CERTIFICATE OF CORRECTION

PATENT NO. : 4,634,861
DATED : January 6, 1987
INVENTOR(S) : Ching, et al

It is certified that error appears in the above-identified patent and that said Letters Patent is hereby corrected as shown below:

In Claim 1, Column 4, lines 29-30, the words "a reflective area of" should read -- a reflective area or -- .

Signed and Sealed this

Twenty-fourth Day of March, 1987

Attest:

DONALD J. QUIGG

Attesting Officer

Commissioner of Patents and Trademarks